(12) United States Patent
Yoo

(10) Patent No.: US 6,345,150 B1
(45) Date of Patent: Feb. 5, 2002

(54) SINGLE WAFER ANNEALING OVEN

(75) Inventor: Woo Sik Yoo, Palo Alto, CA (US)

(73) Assignee: WaferMasters, Inc., San Jose, CA (US)

( * ) Notice: Subject to any disclaimer, the term of this patent is extended or adjusted under 35 U.S.C. 154(b) by 0 days.

(21) Appl. No.: 09/452,049

(22) Filed: Nov. 30, 1999

(51) Int. Cl.$^7$ .................................................. F26B 3/30
(52) U.S. Cl. ........................ 392/418; 219/390; 118/724; 392/416
(58) Field of Search .................................. 219/390, 405, 219/411; 118/724, 725, 50.1; 392/416, 418

(56) References Cited

U.S. PATENT DOCUMENTS

| | | | |
|---|---|---|---|
| 4,550,245 A | 10/1985 | Arai et al. | 219/405 |
| 4,680,451 A | 7/1987 | Gat et al. | 219/411 |
| 4,755,654 A | 7/1988 | Crowley et al. | 219/405 |
| 4,857,689 A | 8/1989 | Lee | 219/10.71 |
| 4,886,954 A | 12/1989 | Yu et al. | 219/390 |
| 5,060,354 A | 10/1991 | Chizinsky | 29/25.02 |
| 5,114,242 A | 5/1992 | Gat et al. | 374/128 |
| 5,155,336 A | 10/1992 | Gronet et al. | 219/411 |
| 5,165,796 A | 11/1992 | Gat et al. | 374/128 |
| 5,208,643 A | 5/1993 | Fair | 356/43 |
| 5,225,663 A * | 7/1993 | Matsumura et al. | 219/543 |
| 5,252,807 A | 10/1993 | Chizinsky | 219/390 |
| 5,294,778 A | 3/1994 | Carman et al. | 219/385 |
| 5,317,492 A | 5/1994 | Gronet et al. | 362/294 |
| 5,387,557 A | 2/1995 | Takagi | 437/247 |
| 5,418,885 A | 5/1995 | Hauser et al. | 392/416 |
| 5,436,172 A | 7/1995 | Moslehi | 437/8 |
| 5,444,217 A | 8/1995 | Moore et al. | 219/405 |
| 5,536,918 A * | 7/1996 | Ohkase et al. | 219/390 |
| 5,561,735 A | 10/1996 | Camm | 392/416 |
| 5,567,909 A | 10/1996 | Sugarman et al. | 136/201 |
| 5,584,936 A | 12/1996 | Pickering et al. | 118/728 |
| 5,635,093 A | 6/1997 | Arena et al. | 219/466 |
| 5,639,301 A | 6/1997 | Sasada et al. | 118/52 |
| 5,647,945 A | 7/1997 | Matsuse et al. | 156/345 |
| 5,651,670 A | 7/1997 | Okase et al. | 432/5 |
| 5,653,808 A * | 8/1997 | MacLeish et al. | 118/715 |
| 5,654,417 A | 8/1997 | Tarr et al. | 536/24.32 |
| 5,654,904 A | 8/1997 | Thakur | 364/557 |
| 5,683,518 A | 11/1997 | Moore et al. | 118/730 |
| 5,715,361 A | 2/1998 | Moslehi | 392/416 |
| 5,830,277 A | 11/1998 | Johnsgard et al. | 118/752 |
| 5,837,555 A | 11/1998 | Kaltenbrunner et al. | 437/248 |
| 5,872,889 A | 2/1999 | Kaltenbrunner et al. | 392/418 |

(List continued on next page.)

FOREIGN PATENT DOCUMENTS

| | | | |
|---|---|---|---|
| WO | WO 96/41109 | 12/1996 | F27D/5/00 |
| WO | WO 99/45745 | 9/1999 | H05B/1/02 |

OTHER PUBLICATIONS

"Slip–Free Rapid Thermal Processing in Single Wafer Furnace," Woo Sik Yoo et al., Jpn. J. Appl. Phys. vol. 39 (2000), pp. L493–L496, Part 2, No. 6A, Jun. 1, 2000, ©2000 The Japan Society of Applied Physics.

(List continued on next page.)

Primary Examiner—Teresa Walberg
Assistant Examiner—Shawntina Fuqua
(74) Attorney, Agent, or Firm—Skjerven Morrill MacPherson LLP; Theodore P. Lopez

(57) ABSTRACT

A heating apparatus for isothermally distributing a temperature across a semiconductor device or wafer during processing. The invention includes a chamber configured to receive a single semiconductor wafer. Housed within the chamber is a heating member or heating plate. Disposed on a periphery of the heating member is a heat source. Heat energy radiating from the heat source conducts through the heating member to create an isothermal temperature distribution across the heating member. Wafer supports are included on the heating plate which support the wafer in close proximity to the heating plate, such that the temperature of the heating plate establishes the temperature of the wafer. Advantageously, this configuration permits the temperature to be uniformly and isothermally distributed over the wafer.

24 Claims, 3 Drawing Sheets

U.S. PATENT DOCUMENTS

| | | | |
|---|---|---|---|
| 5,908,292 A | 6/1999 | Smith et al. | 432/197 |
| 5,930,456 A | 7/1999 | Vosen | 392/416 |
| 5,958,140 A | 9/1999 | Arami et al. | 118/725 |
| 6,002,109 A | 12/1999 | Johnsgard et al. | 219/390 |
| 6,025,575 A | 2/2000 | Park et al. | 219/405 |

OTHER PUBLICATIONS

"Single Wafer Furnace and Its Thermal Processing Applications," Woo Sik Yoo et al., Jpn. J. Appl. Phys. vol. 39 (2000), pp. L694–L697, Part 2, No. 7A, Jul. 1, 2000, ©2000 The Japan Society of Applied Physics.

"SOG Annealing Keeps Its Cool," Woo Sik Yoo and Takashi Fukada, WaferMasters; Jiro Yamamoto, NEC Hiroshima; reprinted from European Semiconductor Aug. 2000.

"Thermal Processing in a Single Wafer Rapid Thermal Furnace," Woo Sik Yoo, Taro Yamazaki, WaferMasters Inc., San Jose, California; Keiichi Enjoji, Tokyo Electron Ltd., Tokyo, Japan; Reprinted from the Jul. 2000 edition of "Solid State Technology," Copyright 2000 by PennWell Corporation.

"The "Hot Shot" Headed–Platen Rapid Thermal Processor," George Chizinsky, HeatFlow Technologies, 143 West Street, Beverly Farms, MA 01915.

"A Proposed RTP Concept for Low Temperature Applications," George Chizinsky, HeatFlow Technologies, 143 West Street, Beverly Farms, MA 01915.

Woo Sik Yoo et al., "Susceptor–Based Rapid Thermal Processing System and Its Silicide Application", Jpn.J.Appl.Phys., vol. 37 (1998) pp. L1135–L1137, Part 2, No. 10A, Oct. 1, 1998.

Woo Sik Yoo et al., "Highly Reliable, Backside Emissivity Independent Cobalt Silicide Process Using a Susceptor–Based Low Pressure Rapid Thermal Processing System", Jpn.J.Appl.Phys., vol. 37 (1998) pp. L1221–L1223, Part 2, No. 10B, Oct. 15, 1998.

Woo Sik Yoo et al., "Wafer Temperature Characterization in a Susceptor–Based, Low Pressure Rapid Thermal Processing System," 7th Int. Conf. on Advanced Thermal Processing of Semiconductors (RTP '99), Colorado Springs, Sep. 1999, pp. 1–6.

Woo Sik Yoo et al., "Characterization of a Susceptor–Based, Low Pressure RTP System in the Temperature Range of 400–1150° C", 6th Int. Conf. on Advanced Thermal Processing of Semiconductors (RTP '98), Kyoto, Japan,, Sep. 1998, pp. 1–8.

Woo Sik Yoo et al., "Very Thin Cobalt Silicide Formation and Annealing in a Susceptor–Based Low Pressure RTP System," 6th Int. Conf. on Advanced Thermal Processing of Semiconductors (RTP '98), Kyoto, Japan,, Sep. 1998, pp. 1–5.

George Chizinsky, "The HotShot Heated–Platen Rapid Thermal Processor", pp. 1–8.

"Rapid Thermal Processing: Equipment, Technology, and Process", American Vacuum Society / New Mexico Chapter, C. B. Yarling, May 23, 1997.

* cited by examiner

SINGLE WAFER ANNEALING OVEN

BACKGROUND OF THE INVENTION

1. Field of the Invention

This invention generally relates to semiconductor manufacturing equipment and, more particularly, to an apparatus and method used for rapid thermal processing of a single semiconductor wafer.

2. Description of the Related Art

The advances in fabrication processes, especially of semiconductor devices of decreased dimensions, have necessitated the development of new processing and manufacturing techniques. One such processing technique is know as Rapid Thermal Processing (RTP), which reduces the amount of time that a semiconductor device is exposed to high temperatures during processing. The RTP technique, typically includes irradiating the semiconductor device or wafer with sufficient power to quickly raise the temperature of the wafer and hold it at that temperature for a time long enough to successfully perform a fabrication process, but which avoids such problems as unwanted dopant diffusion that would otherwise occur at the high processing temperatures. Generally, RTP uses a light source and reflectors to heat the wafer. In a conventional rapid thermal processor a lamp is used as the light source because of its low thermal mass, which makes it easy to power up and down very quickly.

Unfortunately, conventional lamp-based RTP systems have considerable drawbacks with regard to uniform temperature distribution. Any single variation in the power output from the lamps can adversely affect the temperature distribution across the wafer. Because most lamp-based systems use lamps with filaments, the wafer is usually rotated to ensure that the temperature non-uniformity due to the filament array is not transferred to the wafer during exposure. The moving parts required to rotate the wafer, adds to the cost and complexity of the system. Another particularly troublesome area for maintaining uniform temperature distribution is at the outer edges of the wafer. Most conventional RTP systems have no adequate means to adjust for this type of temperature non-uniformity. As a result, transient temperature fluctuations occur which may cause the formation of slip dislocations in the wafer at high temperatures (e.g.~1000° C.).

Conventional lamp-based RTP systems have other drawbacks. For example, there are no adequate means for providing uniform power distribution and temperature uniformity during transient periods, such as when the lamps are powered on and off. Repeatability of performance is also usually a drawback of lamp-based systems, since each lamp tends to perform differently as it ages. Replacing lamps can also be costly and time consuming, especially when one considers that a given lamp system may have upwards of 180 lamps. The power requirement may also be costly, since the lamps may have a peak power consumption of about 250 kWatts.

For the above reasons, what is needed is an apparatus and method for isothermally distributing a temperature across the surface of a semiconductor device during rapid thermal processing.

SUMMARY OF THE INVENTION

The present invention provides a heating apparatus for isothermally distributing a temperature across a semiconductor device or wafer during processing. The invention includes an RTP chamber configured to receive a single semiconductor wafer. Housed within the chamber is a heating member or heating plate. Disposed on a periphery of the heating member is a heat source. Heat energy radiating from the heat source conducts through the heating member to create an isothermal temperature distribution across the heating member. Wafer supports are included on the heating member which support the wafer in close proximity to the heating plate, such that the temperature of the heating plate establishes the temperature of the wafer. Advantageously, this configuration permits the temperature to be uniformly and isothermally distributed over the wafer since the temperature distribution over the heating member is easier to achieve and maintain. The heating member may have a larger dimension than the outer dimension of the wafer, to ensure that the uniform temperature distribution at the outer edge of the wafer is maintained isothermal. Alternatively, a plurality of heating members may be stacked together within the process chamber. In this manner, the heating plates may be positioned above and below the wafer, such that the temperature of both heating plates influences the temperature distribution across the wafer.

In one aspect of the present invention, an apparatus is provided for heating a wafer during processing. The apparatus includes a process chamber, which defines a cavity. Disposed within the cavity is a heatable plate, which is configured to receive a wafer thereon. A heat source is disposed at a periphery of the heatable plate for creating a uniform temperature distribution across the heatable plate.

In another aspect of the present invention, a reactor is provided for rapidly and uniformly annealing a semiconductor wafer. The reactor includes a chamber, which defines a cavity. Disposed in the cavity is a conductive heating member. The heating member is configured to receive a wafer thereon. The reactor also includes a plurality of resistive heating elements positioned proximate to the chamber. A thermal energy output from each of the resistive heating elements provides a substantially isothermal temperature in the cavity.

The present invention overcomes the disadvantages of a lamp-based heating system since the heating member can provide a more uniform temperature distribution, for less power and reduced cost. The heating member can also conduct heat at a faster rate than the wafer, so that the wafer can more quickly arrive at the uniform temperature. No moving parts, such as lift pins or wafer spinners, are required within the cavity to load the wafer, nor are other complex and costly components, such as reflectors, actuators, and complex power transformers and controllers. Since the invention does not require large lamps for heating nor moving parts, the size of the chamber, as well as the volume of the cavity, may be substantially reduced relative to other chambers. The reduced volume and size are of particular advantage for reasons that are made apparent below.

These and other features and advantages of the present invention will be more readily apparent from the detailed description of the preferred embodiments set forth below taken in conjunction with the accompanying drawings.

DETAILED DESCRIPTION

Figure 1A:
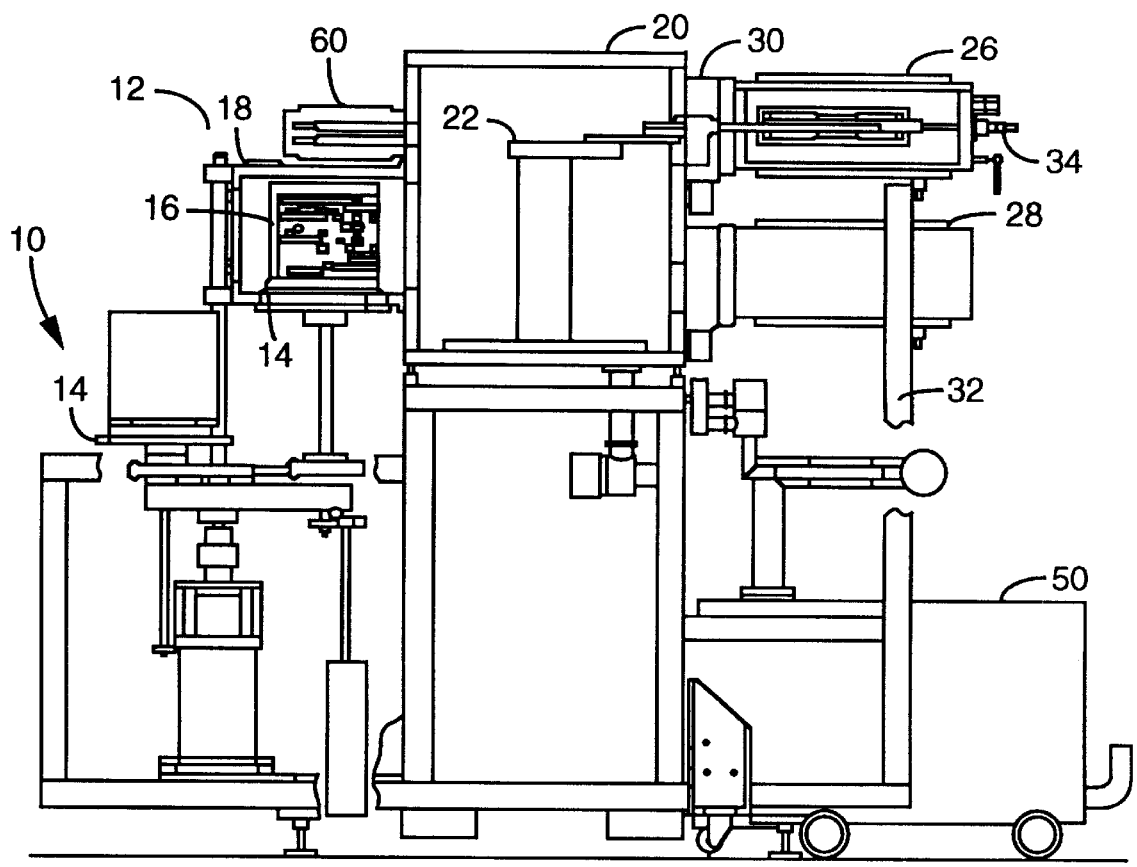
FIGS. 1A and 1B are schematic illustrations of a side view and top view, respectively, of one embodiment of a semiconductor wafer processing system for use with the present invention.
Figure 1B:
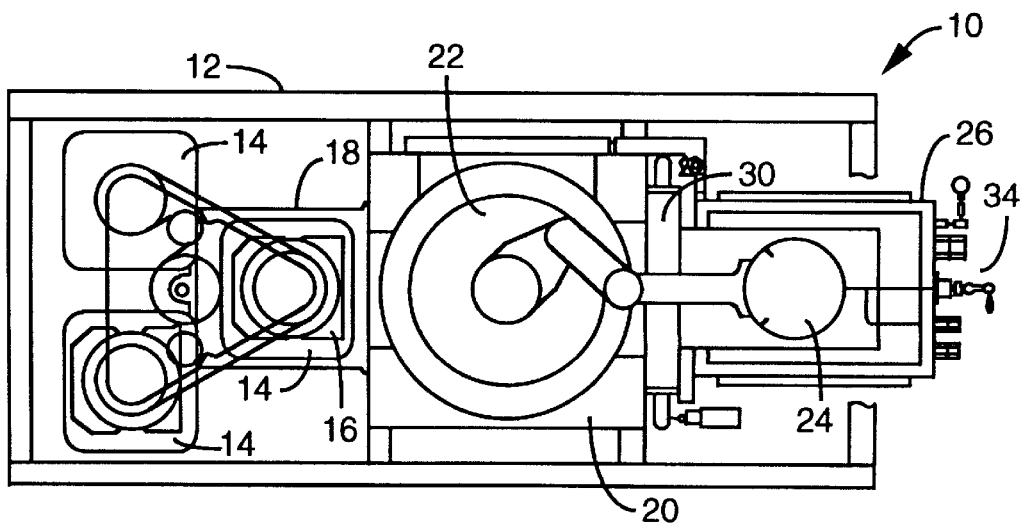

FIGS. 1A and 1B are schematic illustrations of a side view and top view, respectively, of one embodiment of a semiconductor wafer processing system 10 that establishes a representative environment of the present invention. The representative system is fully disclosed in co-pending U.S. patent application Ser. No. 09/451,677, filed Nov. 30, 1999, which is herein incorporated by reference for all purposes. Processing system 10 includes a loading station 12 which has multiple platforms 14 for supporting and moving a wafer cassette 16 up and into a loadlock 18. Wafer cassette 16 may be a removable cassette which is loaded into a platform 14, either manually or with automated guided vehicles (AGV). Wafer cassette 16 may also be a fixed cassette, in which case wafers are loaded onto cassette 16 using conventional atmospheric robots or loaders (not shown). Once wafer cassette 16 is inside loadlock 18, loadlock 18 and transfer chamber 20 are maintained at atmospheric pressure or else are pumped down to vacuum pressure using a pump 50, if necessary. A robot 22 within transfer chamber 20 rotates toward loadlock 18 and picks up a wafer 24 from cassette 16. A reactor or thermal processing chamber 26, which may also be at atmospheric pressure or under vacuum pressure, accepts wafer 24 from robot 22 through a gate valve 30. Optionally, additional reactors may be added to the system, for example reactor 28. Robot 22 then retracts and, subsequently, gate valve 30 closes to begin the processing of wafer 24. After wafer 24 is processed, gate valve 30 opens to allow robot 22 to pick-up and place wafer 24 into a cooling station 60. Cooling station 60 cools the newly processed wafers, which may have temperatures upwards of 100° C., before they are placed back into a wafer cassette in loadlock 18.

In accordance with the present invention, reactors 26 and 28 are RTP reactors, such as those used in thermal anneals, dopant diffusion, thermal oxidation, nitridation, chemical vapor deposition, and similar processes. Reactors 26 and 28 are generally horizontally displaced, however in a preferred embodiment, reactors 26 and 28 are vertically displaced (i.e. stacked one over another) to minimize floor space occupied by system 10. Reactors 26 and 28 are bolted onto transfer chamber 20 and are further supported by a support frame 32. Process gases, coolant, and electrical connections may be provided through the rear end of the reactors using interfaces 34.

Figure 2:
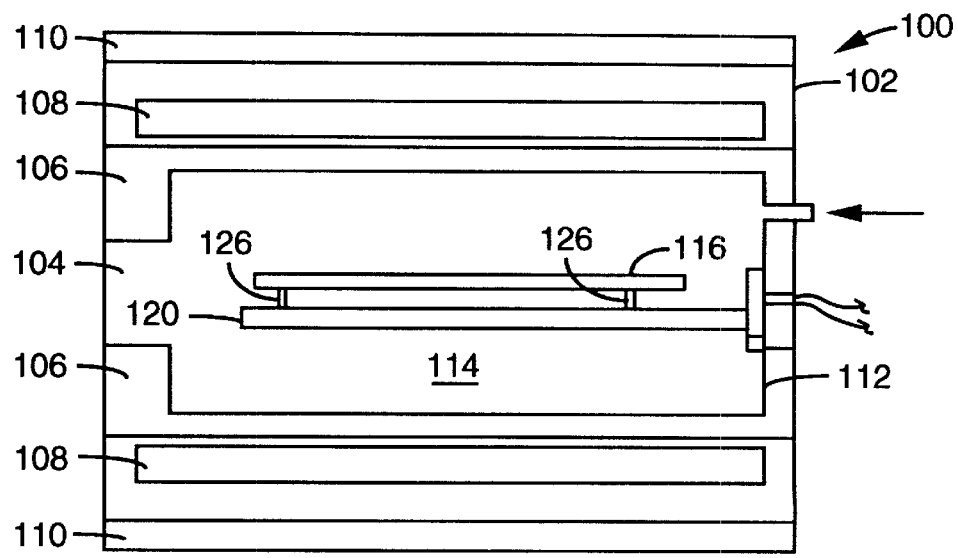
FIG. 2 is a simplified cross-sectional view of a reactor chamber in accordance with one embodiment of the present invention.

FIG. 2 is a simplified cross-sectional view of reactor chamber 100 in accordance with one embodiment of the present invention. Externally, reactor chamber 100 may be a metallic shell 102, preferably made of aluminum or similar metal, having an opening 104 provided on a face of shell 102, configured to receive a wafer for processing. Optionally, to protect users and/or equipment near reactor chamber 100, the chamber may include thermal insulation layers 106 and 108. The insulation layers may be made of any suitable insulation, such as a ceramic fiber material. Alternatively, a detachable water cooled jacket 110 or similar device may be used to surround reactor chamber 100. The water cooled jacket 110 ensures that the reactor does not become too hot, so as to be a hazard to nearby equipment or personnel.

As shown in FIG. 2, reactor chamber 100 includes a process chamber 112, which defines an interior cavity 114. In a preferred embodiment, the volume of process chamber 112 may be kept small, for example, usually no greater than 3000 cm$^3$. Preferably, the volume of process chamber 112 is 1000 cm$^3$. Accordingly, the small process chamber volume allows reactor chamber 100 to be made smaller, and as a result, system 10 may be made more compact, requiring less clean room floor space. The smaller reactor size, in conjunction with the use of the robot loader, allows multiple reactors to be used in system 10 by vertically stacking the reactors as shown in FIG. 1A.

Opening or aperture 104 of reactor chamber 100 allows for the loading and unloading of wafer 116 before and after processing. Aperture 104 may be a relatively small opening, but with a width large enough to accommodate a wafer of between about 0.5 to 2 mm thick and up to 300 mm (~12 in.) in diameter, and robot arm 22 passing therethrough. In one embodiment, during a processing procedure an edge of wafer 116 may be no less than 50 mm from aperture 104 when the wafer is positioned in the process chamber. Preferably, the height of aperture 104 is no greater than between about 15 mm and 40 mm, preferably, no greater than 20 mm. The relatively small aperture size helps to reduce radiation heat loss from process chamber 112. Also, the small aperture size keeps down the number of particles entering process chamber 112 and allows for easier maintenance of the isothermal temperature environment.

Figure 3A:
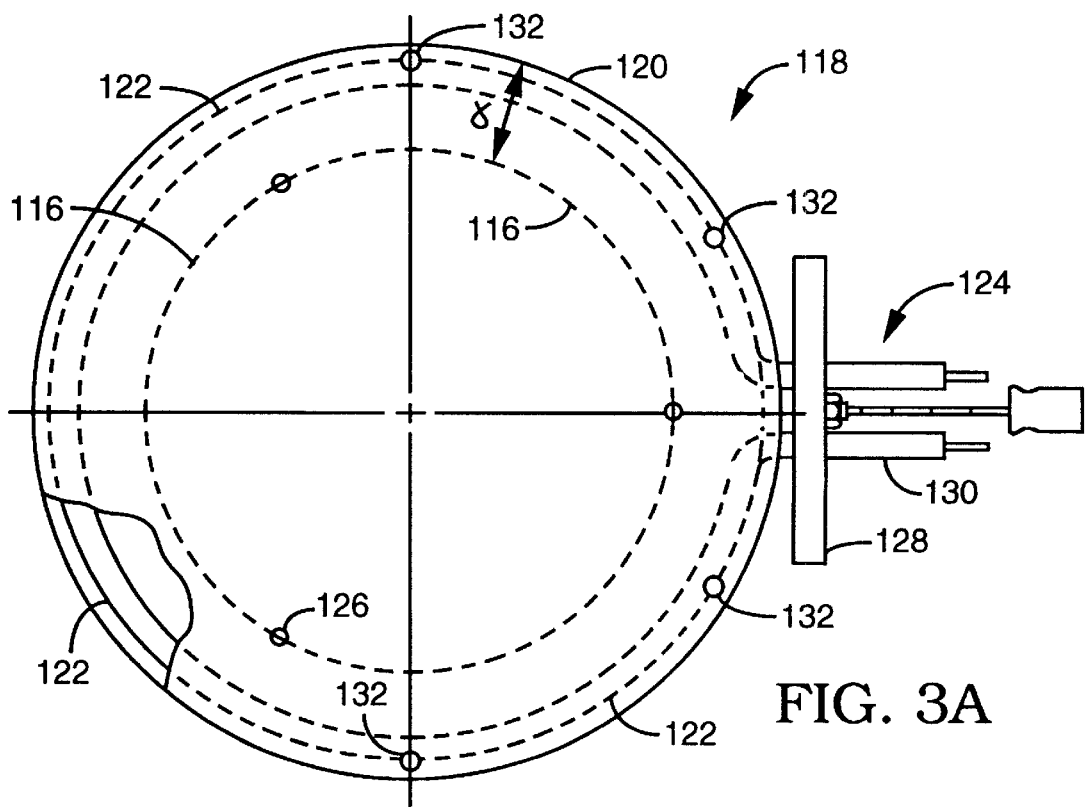
FIGS. 3A and 3B, shown an embodiment of the heating member of the present invention.
Figure 3B:
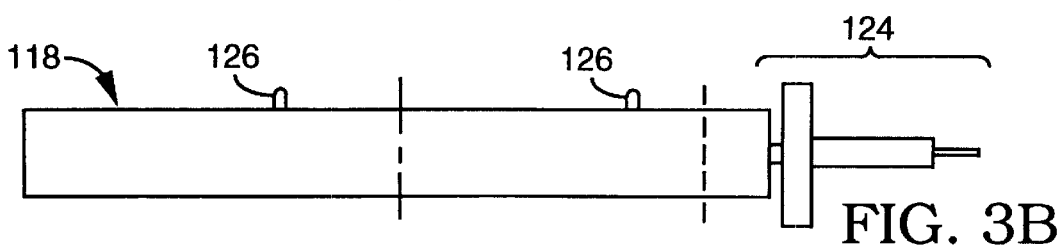

FIGS. 3A and 3B, show an embodiment of the heating assembly of the present invention. Heating assembly 118 includes heating member or plate 120, at least one heat source 122, and a coupling mechanism 124. In a preferred embodiment, heating assembly 118 may be positioned suspended within process chamber 112, in a cantilevered relationship on a wall of process chamber 112. Alternatively, heating assembly 118 may rest on mounts emanating up from a floor of process chamber 112.

Heating plate 120 may have a large mass relative to wafer 116, and may be fabricated from a material, such as silicon carbide, quartz, inconel, aluminum, steel, or any other material that will not react at high processing temperatures with any ambient gases or with wafer 116. Arranged on a top surface of heating plate 120 may be wafer supports 126. In a preferred embodiment, wafer supports 126 extend outward from the surface of heating member 120 to support the single wafer 116. Wafer supports 126 are sized to ensure that wafer 116 is held in close proximity to heating member 120. For example, wafer supports 126 may each have a height of between about 50 µm and about 20 mm, preferably about 2 mm to about 8 mm. The present invention includes at least three wafer supports 116 to ensure stability. However, the total contact area between wafer supports 126 and wafer 116 is less than about 350 mm$^2$, preferably less than about 300 mm$^2$. In one embodiment, thermocouples may be strategically placed embedded within at least one wafer support 126 to provide feedback as to the temperature of wafer 116. The thermocouples may be conventional R-type or K-type thermocouples available from Omega Corporation of Stamford, Conn.

Heating plate 120 may be formed into any geometric shape, preferably a shape which resembles that of the wafer. In a preferred embodiment, heating plate 120 is a circular plate. The dimensions of heating plate 120 may be larger than the dimensions of wafer 116, such that the surface area of the wafer is completely overlaid by the surface area of heating plate 120. As illustrated in FIG. 3A, the diameter of heating plate 120 may be no less than the diameter of wafer 236, preferably, the diameter of heating plate 120 is greater than the diameter of wafer 116. For example, the radius of heating plate 120 is greater than the radius of wafer 116 by about a length γ, which is between about 1 mm and 100 mm, preferably 25 mm.

On a periphery of heating plate 120 is at least one heat source 122. Heat source 122 may be a resistive heating element or other conductive/radiant heat source, which can be made to contact a peripheral portion of heating plate 120 or may be embedded within heating plate 120. The resistive heating element may be made of any high temperature rated material, such as a suitable resistively heatable wire, which is made from a high mass material for increased thermal response and high temperature stability, such as SiC, SiC coated graphite, graphite, AlCr, AlNi and other alloys. Resistive heating elements of this type are available from Omega Corp. of Stamford, Conn.

The temperature of heating plate 120 may be controllable to provide a variable temperature depending on the application. However, once heating plate 120 is heated to a preferred temperature, the temperature of the plate remains uniform and consistent. Preferably, the temperature of heating plate 120 may be varied between about 50° C. and about 1500° C., preferably between about 100° C. and about 1200° C.

Coupling mechanism 124 includes a mounting bracket 128 and electrical leads 130 to provide an electrical power connection to heat source 122. Mounting bracket 128 is coupled to an internal wall of process chamber 112 using conventional mounting techniques. Once mounted, electrical leads 130 can extend outside of process chamber 112 to be connectable to an appropriate power source. The power source may be a direct line voltage of between about 100 volts and about 500 volts.

Figure 4:
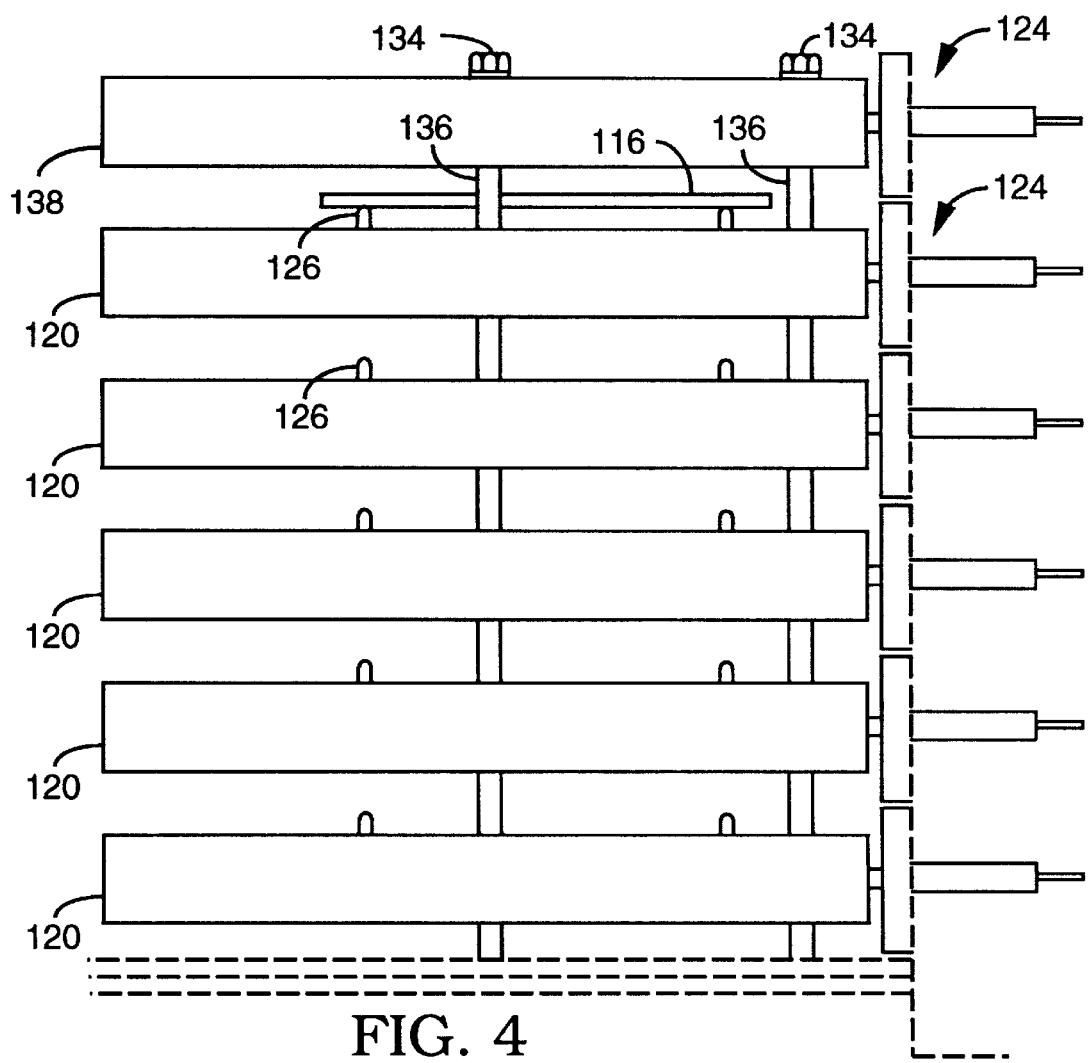
FIG. 4 is an illustration of an embodiment of the present invention.

FIG. 4 is an illustration of yet another embodiment of the present invention. As shown in the figure, a plurality of heating members 120 may be stacked together within process chamber 112. In a preferred embodiment, mounting holes 132 (FIG. 3A) are provided on a periphery of heating member 120 and extend therethrough. Any appropriate number of mounting holes may be used to ensure that heating plates 120 are well supported. However, each mounting hole is positioned, such that the loading/unloading of wafer 116 is not hampered. Preferably, as illustrated in FIG. 3A, each mounting hole 132 is positioned on a half of heating member 120 away from aperture 104 and near coupling mechanism 124. This arrangement ensures that the loading/unloading of wafer 116 onto heating member 120 is not impeded. In one embodiment, a rod 134 or similar member is threaded through mounting holes 132 and spacers 136. Spacers 136 keep heating members 120 an appropriate distance away from one another, which ensures that wafer supports 126 and wafer 116 can be fit in-between the stacked heating members by, for example, robot arm 22. Preferably, the distance between the stacked heating plates may be between about 10 mm and 50 mm, more preferably about 20 mm. The top most stacked heating plate 138 may be the same in structure and performance as the other heating members, except that the top most heating member 138 may not have a wafer placed upon it. As can be best understood from FIG. 4, in the stacked arrangement, wafer 116 can be heated from top and bottom, which may provide a more uniform and consistent heating environment across the wafer.

Figure 5:
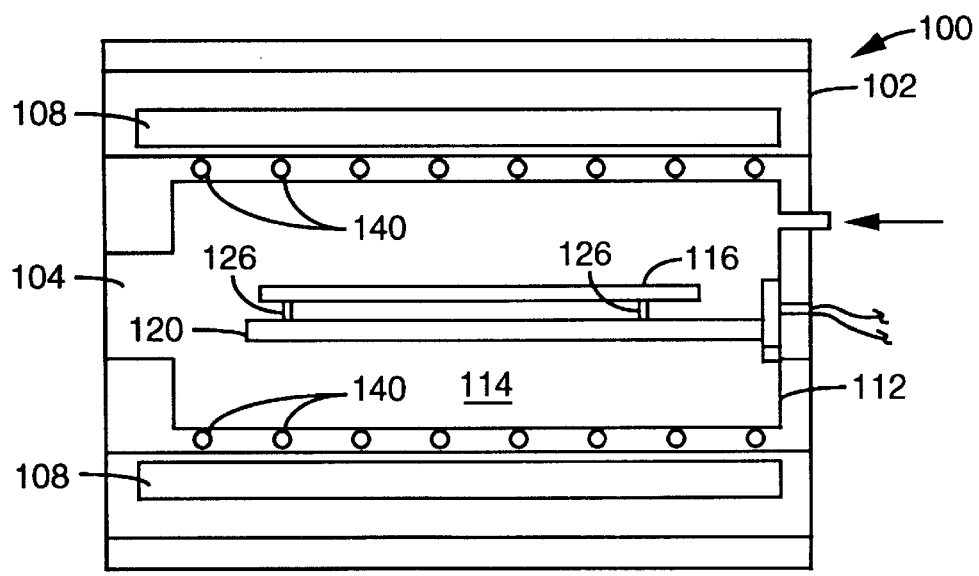
FIG. 5 is a simplified schematic illustration of an embodiment of the present invention.

FIG. 5 shows an alternative embodiment of the present invention. In the alternative embodiment, a plurality of heating elements 140, surround a top and a bottom portion of process chamber 112. Resistive heating elements 140 may be disposed in parallel across process chamber 112. Resistive heating element 140 includes a resistive heating element core and a filament wire. The element core is typically made of a ceramic material, but may be made of any high temperature rated, non-conductive material. The filament wire is conventionally wrapped around the core to allow for an optimal amount of radiated heat energy to emanate from the element. Filament wire may be any suitable resistively heatable wire, which is made from a high mass material for increased thermal response and high temperature stability, such as SiC, SiC coated graphite, graphite, NiCr, AlNi, and other alloys. Preferably, resistive heating filament wire 252 is made of a combination Al—Ni—Fe material, known commonly as Kantal A-1 or AF, available from Omega Corp. of Stamford, Conn. A direct line voltage of between about 100 volts and about 480 volts may be used to power the resistive elements. Thus, no complex power transformer are needed in the present invention for controlling the output of resistive heating elements 140.

It should be understood that the wafer described above may be made of conventional materials commonly used in the industry, such as silicon, gallium arsenide, or other similar compound or the wafer may be a semiconductor wafer, made from quartz or glass.

Having thus described the preferred embodiments, persons skilled in the art will recognize that changes may be made in form and detail without departing from the spirit and scope of the invention. Thus the invention is limited only by the following claims.

What is claimed is:

1. An apparatus for heating a wafer during processing, the apparatus comprising:
    a process chamber defining a cavity;
    a first heatable plate disposed in said cavity configured to receive a wafer thereon said heatable plate remaining stationary in said cavity relative to said process chamber;
    a second heatable plate disposed in said cavity proximate and adjacent to said first heatable plate, said wafer disposed therebetween, free of contact with said first heatable plate and said second heatable plate; and
    a resistive heating element contacting each of said first and second heatable plates, said first and second heatable plates conducting heat from said resistive heating element to create a uniform temperature distribution across said heatable plate, said wafer sensing thermal energy output from said first heatable plate and said second heatable plate.

2. The apparatus of claim 1, further comprising a plurality of heating elements positioned proximate to said process chamber, a thermal energy output from each of said heating elements capable of heating said process chamber to create a substantially isothermal enviromnment in said cavity.

3. The apparatus of claim 2, wherein each of said resistive heating elements comprises a ceramic core wrapped with a wire comprising Al—Ni—Fe.

4. The apparatus of claim 1, wherein said process chamber comprises a material selected from the group consisting of quartz and silicon carbide.

5. The apparatus of claim 1, wherein said first and said second heatable plates comprise circular disks.

6. The apparatus of claim 5, wherein each of said circular disks has a radius greater than a radius of said wafers.

7. The apparatus of claim 1, wherein each of said first and second heatable plates is made of a material selected from the group consisting of silicon carbide, quartz, inconel, aluminum, and steel.

8. The apparatus of claim 1, further comprising a wafer support disposed on a surface of said first heatable plate upon which said wafer can be positioned to maintain said wafer free of contact with said first heatable plate.

9. The apparatus of claim 1, wherein said heat source comprises a resistive heating device.

10. A reactor for rapidly and uniformly annealing a semiconductor wafer, the reactor comprising:

a chamber defining a cavity;

a first conductive heating member in said cavity configured to receive a wafer thereon and to remain stationary relative to said chamber;

a second conductive heating member in said cavity positioned adjacent to said first conductive heating member;

wafer supports disposed on a surface of said first conductive heating member upon which said wafer can be positioned to maintain said wafer free of contact with said first conductive heating member; and a plurality of resistive heating devices each in contact with corresponding first and second conductive heating members to create a uniform temperature distribution across each of said first and second conductive heating members, said wafer sensing thermal energy output from said first conductive heating member and said second conductive heating member.

11. The reactor of claim 10, further comprising a plurality of resistive heating elements positioned proximate to said chamber, a thermal energy output from each of said resistive heating elements providing a substantially isothermal temperature in said cavity.

12. The reactor of claim 10, wherein said process chamber comprises a material selected from the group consisting of quartz and silicon carbide.

13. The reactor of claim 10, wherein said first and second conductive heating members comprise circular disks, wherein said circular disks have a radius greater than a radius of said wafer.

14. The reactor of claim 10, wherein said wafer remains stationary during processing.

15. The reactor of claim 10, wherein said first and second conductive heating members comprise a material selected from the group consisting of silicon carbide, quartz, inconel, aluminum, and steel.

16. The reactor of claim 10, wherein said wafer supports comprise at least three wafer supports on a surface of said first conductive heating member.

17. The reactor of claim 10, wherein a total contact area between said wafer supports and said wafer is less than about 300 $mm^2$.

18. An apparatus for heating a wafer during processing, the apparatus comprising:

a process chamber defining a cavity;

a plurality of heatable members disposed in said cavity in a vertically stacked configuration;

a wafer support mechanism disposed on a surface of each of said heatable members upon which a wafer can be positioned to maintain said wafer free of contact with said surface of said heatable members; and a heat source disposed on a periphery of each of said heatable members to conduct heat through said heatable members to create a uniform temperature distribution across each of said heatable members, said wafer sensing thermal energy output from proximately stacked heatable members.

19. The apparatus of claim 18, further comprising a plurality of heating elements positioned proximate to said process chamber, a thermal energy output from each of said heating elements capable of heating said process chamber to create a substantially isothermal environment in said cavity.

20. The apparatus of claim 18, wherein each of said plurality of heatable members comprise a circular disk.

21. The apparatus of claim 20, wherein each of said circular disks has a radius greater than a radius of said wafers.

22. The apparatus of claim 18, wherein each of said heatable members comprises a meterial selected from the group consisting of silicon carbide, quartz, inconel, aluminum, and steel.

23. The apparatus of claim 18, wherein said wafer support mechanism comprises at least three wafer standoffs.

24. The apparatus of claim 18, wherein a total contact area between said wafer support mechanism and said wafer is less than about 300 $mm^2$.

* * * * *